United States Patent
Wang et al.

(10) Patent No.: US 8,531,565 B2
(45) Date of Patent: Sep. 10, 2013

(54) FRONT SIDE IMPLANTED GUARD RING STRUCTURE FOR BACKSIDE ILLUMINATED IMAGE SENSOR

(75) Inventors: Wen-De Wang, Minsyong Township (TW); Dun-Nian Yaung, Taipei (TW); Jen-Cheng Liu, Hsinchu (TW); Chun-Chieh Chuang, Tainan (TW); Jeng-Shyan Lin, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 387 days.

(21) Appl. No.: 12/710,862

(22) Filed: Feb. 23, 2010

(65) Prior Publication Data

US 2010/0220226 A1    Sep. 2, 2010

Related U.S. Application Data

(60) Provisional application No. 61/154,955, filed on Feb. 24, 2009.

(51) Int. Cl.
*H04N 5/335* (2011.01)
*H04N 5/217* (2011.01)

(52) U.S. Cl.
USPC .......................... 348/294; 348/241

(58) Field of Classification Search
USPC ......... 348/241, 272, 294, 307, 308; 257/126, 257/127, 140, 170, 171, 243, 244, 499, 501, 257/506, 508, 509, 510; 438/25, 26, 42, 438/43, 44, 45, 196, 207, 208, 218, 219, 438/220, 221, 294, 295, 296, 297, 318, 353, 438/355, 356, 359, 400, 404, 405, 406, 412, 438/423
See application file for complete search history.

(56) References Cited

U.S. PATENT DOCUMENTS

| | | | |
|---|---|---|---|
| 4,760,031 | A | 7/1988 | Janesick |
| 4,798,958 | A | 1/1989 | Janesick et al. |
| 5,391,917 | A | 2/1995 | Gilmour et al. |
| 5,510,298 | A | 4/1996 | Redwine |
| 5,767,001 | A | 6/1998 | Bertagnolli et al. |
| 5,998,292 | A | 12/1999 | Black et al. |
| 6,018,187 | A | 1/2000 | Theil et al. |
| 6,163,352 | A | 12/2000 | Ichikawa et al. |
| 6,168,965 | B1 | 1/2001 | Malinovich et al. |
| 6,169,319 | B1 | 1/2001 | Malinovich et al. |
| 6,184,060 | B1 | 2/2001 | Siniaguine |

(Continued)

FOREIGN PATENT DOCUMENTS

| | | |
|---|---|---|
| JP | 2000-021945 | 1/2000 |
| JP | 2007-013089 | 1/2007 |
| JP | 2009-016691 | 1/2009 |
| JP | 2010-050149 | 3/2010 |

OTHER PUBLICATIONS

Office Action dated Apr. 3, 2012 from corresponding application No. JP2010-038812.

*Primary Examiner* — Tuan Ho
*Assistant Examiner* — Peter Chon
(74) *Attorney, Agent, or Firm* — Lowe Hautman & Ham, LLP (57) ABSTRACT

An image sensor includes a semiconductor substrate, a guard ring structure in the substrate, and at least one pixel surrounded by the guard ring structure. The guard ring structure is implanted in the substrate by high-energy implantation.

20 Claims, 7 Drawing Sheets

(56) References Cited

U.S. PATENT DOCUMENTS

| | | |
|---|---|---|
| 6,235,549 B1 | 5/2001 | Bawolek |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,489,992 B2 | 12/2002 | Savoye |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,815,787 B1 | 11/2004 | Yaung et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,045,870 B2 | 5/2006 | Wataya |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,089,522 B2 | 8/2006 | Tan et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,268,410 B1 | 9/2007 | Hopper et al. |
| 7,288,481 B2 | 10/2007 | Nemoto |
| 7,297,574 B2 | 11/2007 | Thomas et al. |
| 7,335,972 B2 | 2/2008 | Chanchani |
| 7,355,273 B2 | 4/2008 | Jackson et al. |
| 7,365,298 B2 | 4/2008 | Ryu |
| 7,508,072 B2 | 3/2009 | Morita et al. |
| 7,518,172 B2 * | 4/2009 | Moon et al. .................. 257/292 |
| 7,588,993 B2 | 9/2009 | Liu et al. |
| 7,701,023 B2 | 4/2010 | Rieve et al. |
| 7,781,781 B2 | 8/2010 | Adkisson et al. |
| 7,786,426 B2 | 8/2010 | Yamashita et al. |
| 7,808,064 B2 | 10/2010 | Kawasaki et al. |
| 7,859,033 B2 | 12/2010 | Brady |
| 7,875,840 B2 | 1/2011 | Jiang et al. |
| 7,964,926 B2 | 6/2011 | Kim |
| 7,965,926 B2 | 6/2011 | Kim |
| 7,981,727 B2 | 7/2011 | Liu et al. |
| 8,048,704 B2 | 11/2011 | Smeys et al. |
| 8,049,256 B2 | 11/2011 | Guidash |
| 8,084,798 B2 | 12/2011 | Koike |
| 2004/0169248 A1 | 9/2004 | Costello et al. |
| 2004/0171220 A1* | 9/2004 | Yang et al. .................. 438/270 |
| 2004/0245593 A1 | 12/2004 | Costello et al. |
| 2005/0029643 A1 | 2/2005 | Koyanagi |
| 2005/0030403 A1 | 2/2005 | Yaung et al. |
| 2006/0086956 A1 | 4/2006 | Furukawa et al. |
| 2006/0145222 A1 | 7/2006 | Lee |
| 2006/0278989 A1* | 12/2006 | Trezza .................. 257/773 |
| 2007/0132088 A1 | 6/2007 | Kariay et al. |
| 2007/0152250 A1* | 7/2007 | Kim .................. 257/292 |
| 2007/0262364 A1 | 11/2007 | Hsu et al. |
| 2008/0014673 A1 | 1/2008 | Chiang et al. |
| 2008/0079108 A1 | 4/2008 | Hsu et al. |
| 2008/0169524 A1 | 7/2008 | Kim |
| 2008/0224247 A1 | 9/2008 | Hsu et al. |
| 2008/0237766 A1 | 10/2008 | Kim |
| 2008/0237781 A1* | 10/2008 | Uchiyama .................. 257/508 |
| 2008/0284041 A1 | 11/2008 | Jang et al. |
| 2008/0308890 A1 | 12/2008 | Uya |
| 2009/0026563 A1 | 1/2009 | Katsuno et al. |
| 2009/0032823 A1 | 2/2009 | Im et al. |
| 2009/0051039 A1 | 2/2009 | Kuo et al. |
| 2009/0078973 A1 | 3/2009 | Hsu et al. |
| 2009/0090988 A1 | 4/2009 | Ohgishi |
| 2009/0134485 A1 | 5/2009 | Lee |
| 2009/0146148 A1 | 6/2009 | Pyo |
| 2009/0146325 A1 | 6/2009 | Liu et al. |
| 2009/0160061 A1 | 6/2009 | Hsu et al. |
| 2009/0184423 A1 | 7/2009 | Erturk et al. |
| 2009/0224405 A1 | 9/2009 | Chiou et al. |
| 2009/0278251 A1 | 11/2009 | Tsai et al. |
| 2010/0045637 A1 | 2/2010 | Yamashita |
| 2010/0109006 A1 | 5/2010 | Kobayashi et al. |
| 2010/0151629 A1 | 6/2010 | Oda et al. |
| 2011/0062540 A1 | 3/2011 | Saito et al. |
| 2011/0207258 A1 | 8/2011 | Ahn et al. |

\* cited by examiner

FRONT SIDE IMPLANTED GUARD RING STRUCTURE FOR BACKSIDE ILLUMINATED IMAGE SENSOR

CROSS REFERENCE TO RELATED APPLICATIONS

The present application is based on, and claims priority from, U.S. Provisional Patent Application No. 61/154,955 filed Feb. 24, 2009, the disclosure of which is hereby incorporated by reference herein in its entirety.

The present application is related to U.S. Non-Provisional patent application Ser. No. 12/708,167, filed Feb. 18, 2010, which is based on, and claims priority from, U.S. Provisional Patent Application No. 61/154,940 filed Feb. 24, 2009. The disclosures of the above-listed applications are hereby incorporated by reference herein in their entirety The present application is further related to co-pending U.S. Non-Provisional patent applications: "Method for Improving Sensitivity of Backside Illuminated Image Sensors" by Hsu et al., having U.S. Publication No. 2008/0079108, and "Method of Making a Deep Junction for Electrical Crosstalk Reduction of an Image Sensor" by Chiang et al., having U.S. Publication No. 2008/0014673, both of which are expressly incorporated by reference herein in their entirety.

BACKGROUND

An image sensor provides a grid of pixels, such as photosensitive diodes or photodiodes, reset transistors, source follower transistors, pinned layer photodiodes, and/or transfer transistors, for recording an intensity or brightness of light. Each pixel responds to the light by accumulating charge carriers (such as electrons and/or holes) generated by the light when the light passes into a silicon layer. The more light, the more charge carriers are generated. The charge carriers are measured by sensors and the measurements are then used by other circuits to provide color and brightness information that can be used for suitable applications, such as digital cameras. Common types of pixel grids include a charge-coupled device (CCD) or complementary metal oxide semiconductor (CMOS) image sensor.

In semiconductor technologies, backside-illuminated sensors are used for sensing the amount of light projected toward the back-side surface of a substrate. The sensors, however, are formed on the front side of the substrate. Thus, light must pass through the substrate to reach the sensors. The light can pass through the substrate to reach the sensors, but some of the light is scattered while passing through the substrate. The scattered light reaches neighboring pixels and their corresponding sensors causing crosstalk between various sensor signals.

DESCRIPTION OF THE DRAWINGS

The present disclosure is illustrated by way of example, and not by limitation, in the figures of the accompanying drawings in which elements having the same reference numeral designations represent like elements throughout and wherein.

DETAILED DESCRIPTION

The present disclosure provides, in accordance with one or more embodiments, a backside illuminated CMOS Image Sensor (CIS) and fabrication method for improving electrical crosstalk performance, reducing white pixels and reducing the effect of dark current noise. Described embodiments of the CIS include a grid of pixels or sub-pixels surrounded by a guard ring structure implanted in a substrate. The disclosed CIS and fabrication method reduces the amount of damaged silicon in the guard ring in the finished device by forming the guard ring structure by ion implantation from the front-side surface of a substrate and annealing the guard ring implanted substrate to anneal out damage caused by the implantation and activate implanted dopants. This annealing step is performed before inter-level dielectric (ILD) and multi-layer interconnect (MLI) layer formation, because the anneal step requires temperatures of 450° C. or greater and, in some embodiments 800° C. to 900° C. or higher. Temperatures this high may melt any metal in the MLI layer, destroying that layer. Furthermore many of the barrier layer materials that isolate the MLI layer from the semiconductor devices cannot sustain the above temperatures, causing failure of the semiconductor devices due to migration of metal dopants into the silicon.

Figure 1:
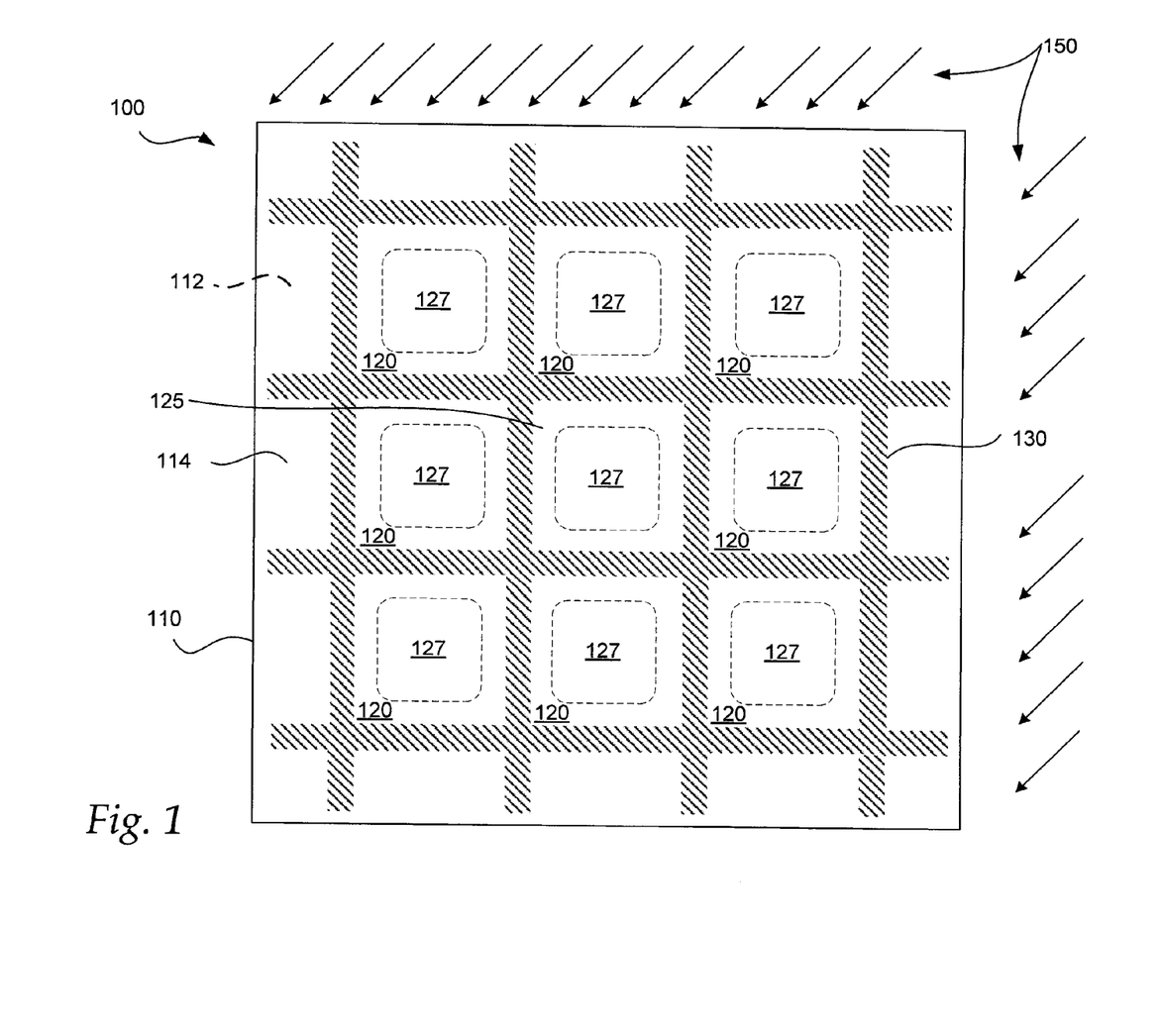
FIG. 1 is a plan view of a backside of a sensor device having a plurality of pixels and a guard ring structure, according to at least one embodiment.

FIG. 1 is a high-level diagram of an image sensor 100 comprising a grid of backside-illuminated (or back-illuminated) pixels 120 formed on or within a semiconductor substrate 110 in accordance with an embodiment. In at least one embodiment, guard ring structure 130 is configured as multiple enclosures, e.g., squares (although other shapes are applicable), each square surrounding a pixel 120, which may, as disclosed herein, comprise multiple pixels. Disclosed methods include providing a semiconductor substrate 110 having a front surface 112 and a back surface 114 wherein a front side implantation process is used to form the guard ring structure 130 implanted from the front side 112. The front side 112 is not visible in FIG. 1 because FIG. 1 depicts the back surface 114 of image sensor 100.

In a sensor without the guard ring structure, light 150 from a light source (not shown), or other radiated signal enters the material forming each of the pixels 120 from the back surface 114. Most of the light 150 that enters a particular pixel, for example, pixel 125 of the pixels 120, is absorbed by that pixel 125. The absorption of the light generates charge carriers in pixel 125. A portion of the light that enters pixel 125, however, is not absorbed by pixel 125. A portion of this unabsorbed light is transmitted through pixel 125 to the front side 112 and another portion of the unabsorbed light is reflected out of the back side 114. The reflected and transmitted portions of the unabsorbed light represent light signal that is not collected by pixel 125 and is, therefore, lost. This merely reduces the size of the light signal sensed by pixel 125.

In addition, some of the light 150 that enters pixel 125, is scattered as that light passes through pixel 125. This scattered light may leave pixel 125, in any direction. Thus, this scattered light may reach a pixel neighboring the pixel 125. If the scattered light is absorbed by that neighboring pixel, it may generate charge carriers, those charge carriers will contribute to the signal of the neighboring pixel causing crosstalk.

Light 150 entering the pixel 125 through back-side surface 114, in a direction normal to the back-side surface 114, passes through only pixel 125, assuming that the light 150 is not scattered. Light 150, entering the pixel 125 through back-side surface 114 at an angle oblique to the direction normal to the back-side surface 114, may also pass through a pixel other than the pixel 125, and therefore, may be absorbed by a pixel other than the pixel 125. This light entering the pixel 125 through back-side surface 114 at an angle oblique to the direction normal to the back-side surface 114, thus, also causes crosstalk between pixels 120.

To prevent, or at least minimize, the above-mentioned crosstalk issues, the guard ring structure 130 is formed from the front-side surface 112 of substrate 110. Because guard ring structure 130 is not as transparent as substrate 110, guard ring structure 130 prevents light in any one pixel 120 from reaching any neighboring pixel. Therefore, the above crosstalk between pixels 120 is reduced or eliminated. Further, the guard ring structure 130 prevents light-generated charge carriers in each pixel, e.g., pixel 125, from drifting into other pixels 120. The guard ring structure 130 thereby reduces both light and electrical crosstalk in output signals of pixels that transform an imaging radiation signal into an electric signal.

Figure 2A:
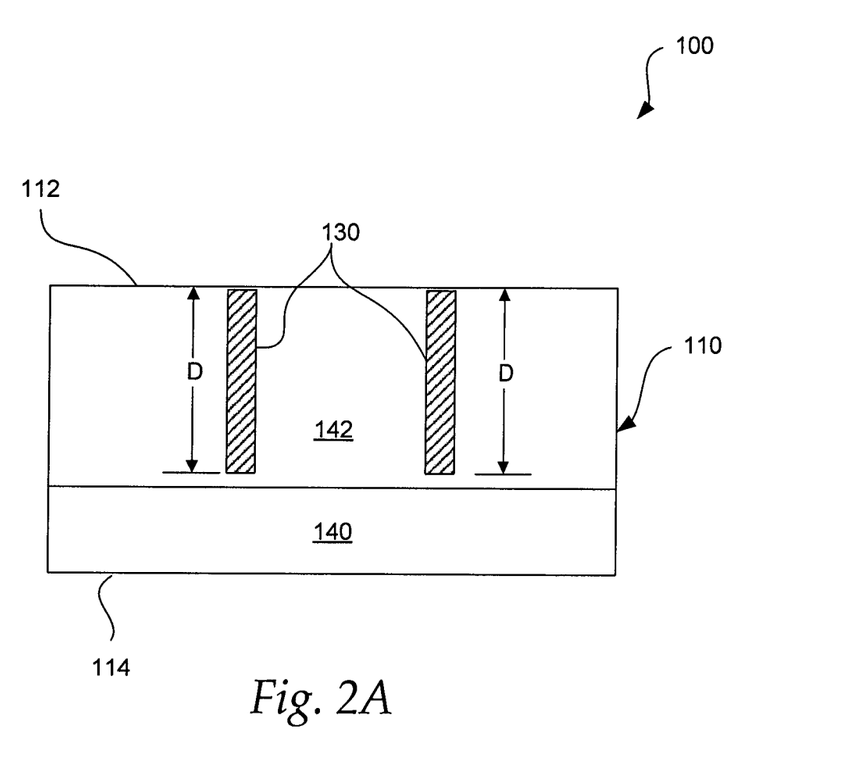
FIGS. 2A-2D are sectional views in the formation of a sensor device according to FIG. 1, wherein a guard ring structure is implanted in the front-side surface of a semiconductor substrate, according to at least one embodiment.

FIG. 2A depicts a front-end-of-line (FEOL) fabrication stage of image sensor 100, wherein the guard ring structure 130 is formed in the semiconductor substrate 110. The substrate 110 includes silicon and, in at least some other embodiments, includes other elementary semiconductor material such as germanium and carbon. In at least some embodiments, the substrate 110 also includes a compound semiconductor such as silicon carbide, gallium arsenic, indium arsenide, and indium phosphide. In at least some embodiments, the substrate 110 includes an alloy semiconductor such as silicon germanium, silicon germanium carbide, gallium arsenic phosphide, and gallium indium phosphide. In at least one embodiment, the substrate 110 comprises P+ type silicon. In at least some embodiments, the substrate 110 further includes various p-type doped regions and/or n-type doped regions. In some embodiments, doping is implemented using a process such as ion implantation or diffusion in various steps and techniques. Furthermore, in at least one embodiment, substrate 110 includes isolation features, which are known in the art to separate different devices formed in the substrate 110. Still further, in at least one embodiment, substrate 110 includes other features such as an epitaxial layer 142, e.g., an epi-layer of p-doped silicon, a semiconductor on insulator (SOI) structure, and/or combinations thereof that results in a P+ layer 140 on the backside of the device 100. The above embodiments are not limited to p-type or p-doped silicon or layers. Any one of these materials or layers may be replaced by n-type or n-doped silicon or layers.

In at least some embodiments, guard ring structure 130 extends from the front-side surface 112 of the substrate 110 toward the back-side surface 114 of substrate 110 and, in at least one embodiment, high energy implantation, such as ion implantation or ion metal plasma implantation, is used on the front-side surface 112 of substrate 110 to form guard ring structure 130. The materials implanted during the implantation include any one of boron, aluminum and gallium as p-type dopants and any one of antimony, phosphorus, arsenic as n-type dopants. Any combination of the above dopants may also be implanted. Typical ion implantation energies for the guard ring structure are in the range of between 400 keV and 2000 keV, and in some embodiments, in the narrower range of between 500 keV and 1500 keV In at least some embodiments, the guard ring structure 130 extends from the front-side surface 112 into the substrate 130. In some embodiments, the guard ring structure 130 has a depth D to provide efficient crosstalk isolation between pixels 120.

Once the front side guard ring structure 130 is implanted, substrate 110 is annealed to strengthen the substrate 110 and reduce brittleness. The annealing step 204 anneals out most or all damage to the substrate caused by any ion implantation and/or activates any implanted dopant material. Annealing is performed using known annealing techniques including laser annealing, Rapid Thermal Annealing (RTA), laser annealing and conventional furnace annealing. Unlike the instant image sensor 100 fabricated using the methods described herein, known image sensor fabrication methods form inter-level dielectric (ILD) and metal multi-layer interconnect (MLI) layers on the front side of the wafer containing the substrate prior to forming a backside sensor isolation structure and annealing. Both laser annealing and RTA require temperatures over 450° C. Therefore, because the known image sensor fabrication methods anneal after the metal layers are formed on the wafer, the metal layers are susceptible to melting, and migration of metal into the semiconductor resulting in damage to the device. The disclosed device and method, on the other hand, obviate this danger by using a front side high energy implantation process to form guard ring structure 130 on the front-side surface 112 of substrate 110 and annealing the guard ring implanted substrate before any MLI 122, (metal layers 122a, 122b), is formed on the front-side surface 112 of substrate 110.

Figure 2B:
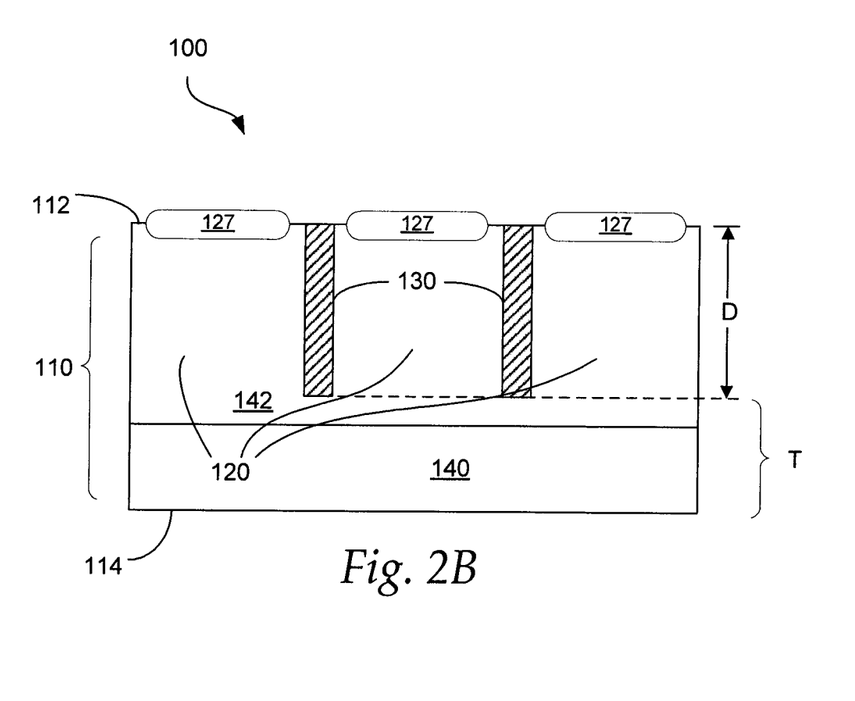

FIG. 2B depicts image sensor device 100 prior to back-end-of-line (BEOL) processing. Each pixel 120 is surrounded by guard ring 130. Image sensing elements 127 that sense light and/or charge carriers are formed on the front-side surface 112 of the semiconductor substrate 110. Each of image sensing elements 127 in some embodiments includes doped regions to have p-type and/or n-type dopants formed in the semiconductor substrate 110 by a method such as diffusion or ion implantation.

In some embodiments, the image sensing elements 127 formed in pixels 120 include photodiodes, phototransistors, complementary metal-oxide-semiconductor (CMOS) image sensors, charged coupled device (CCD) sensors, active sensors, passive sensors, and/or other sensors diffused or otherwise formed in the substrate 110. In various embodiments, the image sensing elements 127 formed in pixels 120 also comprise any active and passive devices including diodes, transistors, switches, resistors and capacitors that are not for light or charge sensing. These additional components may be for selecting pixels of reading, amplification, or any other function necessary for the function of each pixel 120 and the image sensor 100. As such, the pixels 120 comprise known and/or future-developed image sensing devices, and in some embodiments, include a plurality of pixels disposed in a sensor array or other proper configuration. Furthermore, in some embodiments, the plurality of pixels 120 includes various sensor types. For example, in a given configuration one group of pixels includes CMOS devices and another group of pixels includes passive sensors. Moreover, in at least some embodiments, pixels 120 include color image sensors and/or monochromatic image sensors. Backside illuminated image sensor 100 is designed to receive light (or other radiation) directed towards the back surface of the semiconductor substrate 110, eliminating and/or minimizing optical path obstruction by other objects such as gate features and metal lines, and maximizing the exposure of the light-sensing region of the pixel 120. In at least some embodiments, substrate 110 is thinned, i.e., the thickness of the substrate 110 is reduced, such that the light directed through the back surface thereof may effectively reach the pixels 120.

In some embodiments, the formation of pixels 120 and/or image sensing elements 127 and/or the guard ring 130 all requires ion implantation followed by annealing. In at least one of such embodiments, a common annealing step is performed, following any implantations, to anneal more than one of pixels 120, image sensing elements 127 and guard ring 130 at the same time. The implantation may be performed by any currently known or future technique including, but not limited to, ion implantation, high-energy ion implantation and ion metal plasma implantation. The annealing step anneals out damage to the substrate by any implantation and activates the implanted dopants. The annealing may be performed by any currently known or future technique including, but not limited to oven annealing, laser annealing and Rapid Thermal Annealing (RTA). Any implantation and annealing steps to form pixels 120, image sensing elements 127 and the guard ring 130 are performed before forming any part of a multi-layer interconnect.

Figure 2C:
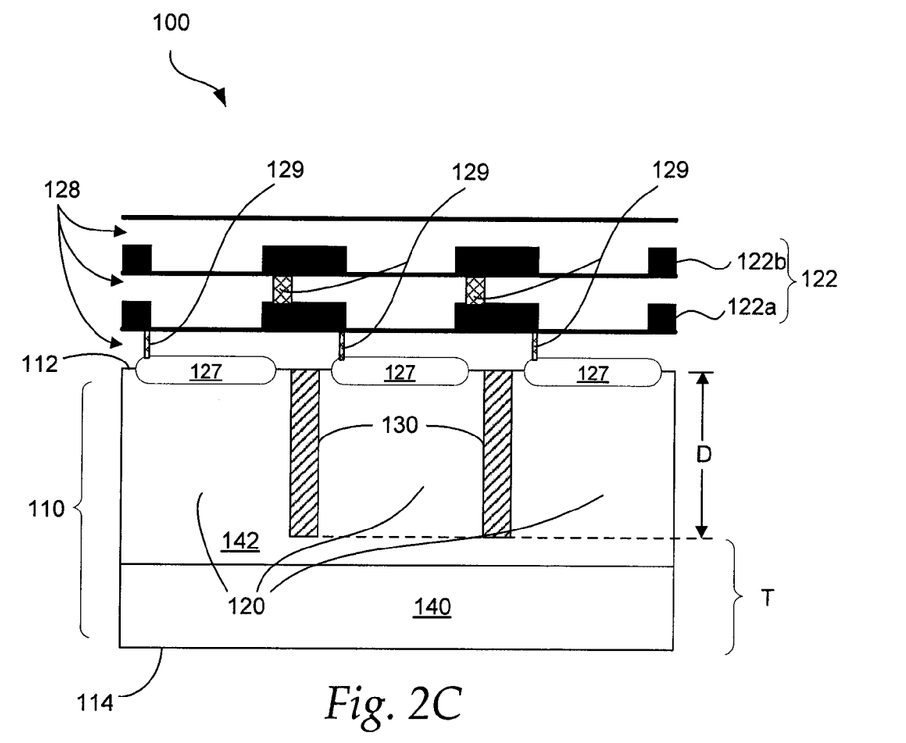

FIG. 2C depicts image sensor device 100 with a multi-layer interconnect (MLI) 122 formed thereon after the processing disclosed with respect to FIG. 2B. MLI 122 comprises, in at least one embodiment, first and second metal layers 122a, 122b, that are electrically connected to pixels 120, such that pixels 120 may receive power and provide signal output to associated circuitry. Metal layers 122a, 122b are separated from each other and the substrate by the interlayer dielectric 128 (inter-level dielectric or ILD). Connections between the metal layers 122a, 122b, as well as connections between devices and the metal layers 122a, 122b, are made by vias 129. In various embodiments, the metal in MLI 122 is routed to avoid the pixel areas. Although in a backside illuminated sensor the metal does not block light from reaching the pixel, the metal layers 122a, 122b cause additional stray capacitance that reduces the pixel response time and also affects the signal-to-noise ratio (SNR). In some embodiments, the metal in MLI 122 are routed to cover the pixel areas. The metal reflects light so that unabsorbed light passing through a pixel is reflected back into the pixel, thereby providing additional opportunity for the light to absorbed. This increases the signal, especially for longer wavelength light that more easily penetrates the pixel material.

The MLI 122 in some embodiments is formed from materials that include aluminum, copper, tungsten, titanium, titanium nitride, tantalum, tantalum nitride, metal silicide or a combination thereof and is formed by processes that include physical vapor deposition (or sputtering), chemical vapor deposition (CVD), or combinations thereof. Other manufacturing techniques that may be used to form MLI 122 include photolithography processing and etching to pattern the conductive materials for vertical (via and contact) and horizontal connects (conductive line). Still other manufacturing processes such as thermal annealing are used to form metal silicide in some embodiments. Alternatively, a copper multi-layer interconnect is used that includes materials such as copper, copper alloy, titanium, titanium nitride, tantalum, tantalum nitride, tungsten, polysilicon, metal silicide, or combinations thereof. In some embodiments, the copper multi-layer interconnect is formed by a technique that includes CVD, sputtering, plating, or other suitable processes. Furthermore, in some embodiments, the metal silicide used in multilayer interconnects includes nickel silicide, cobalt silicide, tungsten silicide, tantalum silicide, titanium silicide, platinum silicide, erbium silicide, palladium silicide, or combinations thereof.

In various embodiments, the interlayer dielectric 128 includes materials such as silicon dioxide, silicon nitride, silicon oxynitride, polyimide, spin-on glass (SOG), fluoride-doped silicate glass (FSG), carbon doped silicon oxide, BLACK DIAMOND™ (available from Applied Materials of Santa Clara, Calif.), XEROGEL™, AEROGEL™, amorphous fluorinated carbon, Parylene, BCB (bis-benzocyclobutenes), SILK™ (available from Dow Chemical of Midland, Mich.), polyimide, and/or other suitable materials. In at least one embodiment, ILD 128 is formed by a technique including spin-on, CVD, sputtering, or other suitable processes. In at least some embodiments, MLI 122 and ILD 128 are formed in an integrated process including a damascene process such as dual damascene processing or single damascene processing.

Figure 2D:
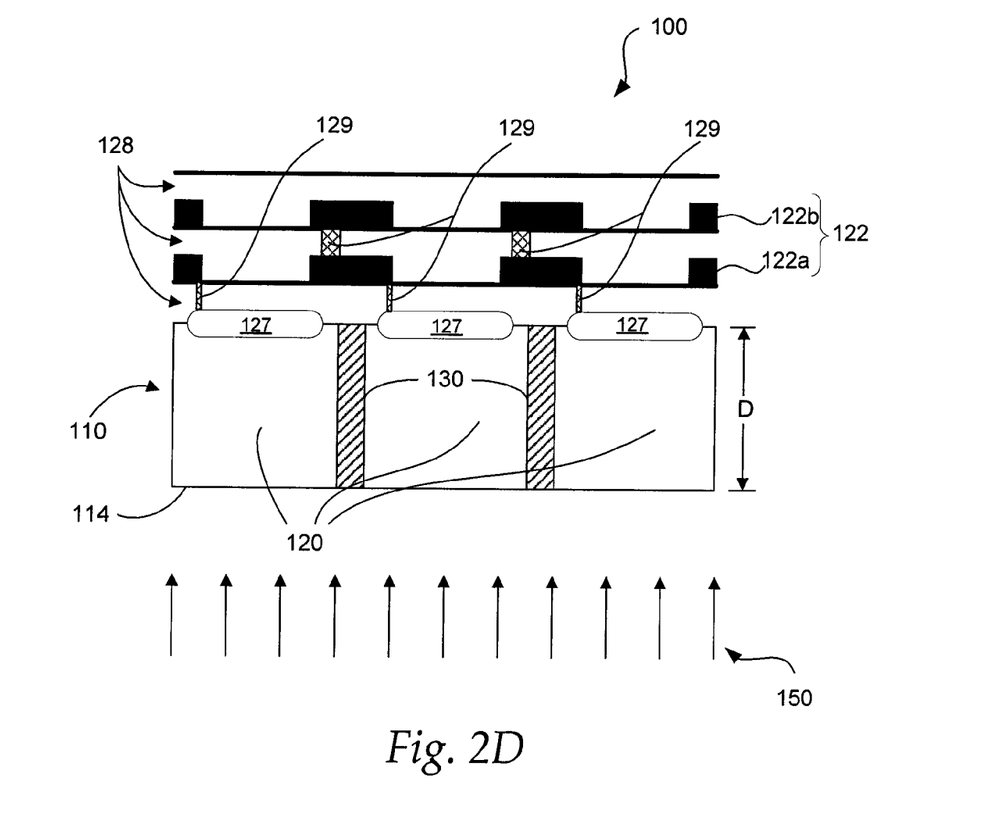

FIG. 2D depicts the image sensor device of FIG. 2C after a back-side portion T (see FIG. 2C) of substrate 110 is thinned to reduce the distance that light 150 from a light source, and/or charge carriers generated in the respective pixel 120 by said light, has/have to travel through the substrate 110 in order to reach image sensing elements 127. In at least one embodiment, substrate 110 is thinned down by first grinding down the back-side surface 114 of the substrate 110 followed by multi-step wet etching to reduce the thickness of substrate 110 to a predetermined thickness. In at least one embodiment, the substrate 110 is thinned down by amount T to reduce the thickness of the substrate 110 to a depth D, equal to the height of guard ring structure 130. Accordingly, in some embodiments, guard ring structure 130 extends from the front-side surface 112 of substrate 110 substantially up to the back-side surface 114 of substrate 110, thus, isolating the pixels 120 from each other.

Figure 3:
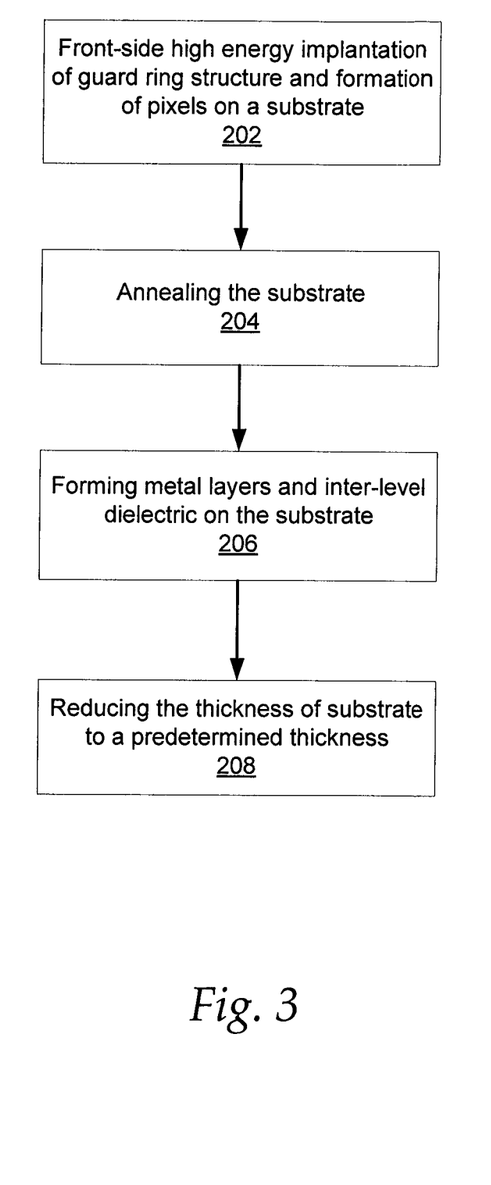
FIG. 3 is a flow chart of an exemplary process for improving the performance of a backside illuminated sensor device, according to at least one embodiment.

FIG. 3 illustrates one embodiment of a process to fabricate the image sensor 100 described above. At step 202 and as disclosed with respect to FIG. 2A, a guard ring 130 is formed in the front-side 112 of a semiconductor substrate 110. In some embodiments, the guard ring 130 is formed via ion metal plasma implantation and extends a predetermined distance D from the front surface 112 of the substrate 110 towards the back surface 114 of the substrate 110. At least one pixel 120 with an image sensing element 127 is formed on or within the front-side surface 112 of the substrate 110, whereby the guard ring 130 surrounds each pixel 120 to prevent light energy and/or charge carriers intended for a particular pixel 120 from spreading to adjacent pixels.

At step 204 and as disclosed with respect to FIG. 2B, the substrate 110 with the implanted guard ring 130 and pixels 120 with image sensing elements 127 is annealed using at least one of commonly known annealing methods including, but not limited to oven annealing, laser annealing and Rapid Thermal Annealing (RTA). In some embodiments, a single common annealing step is performed for both implanted guard ring 130 and pixels 120 with image sensing elements 127.

At step 206 and as disclosed with respect to FIG. 2C, an MLI layer 122 with an ILD is formed on the front-side 112 of the substrate 110 providing electrical connectivity to pixels 120.

At step 208 and as disclosed with respect to FIG. 2D, the thickness of the substrate 110 is reduced, from the backside 114, by a thickness T to a predetermined thickness that, in some embodiments, is equal to the depth D of the guard ring structure 130.

Figure 4:
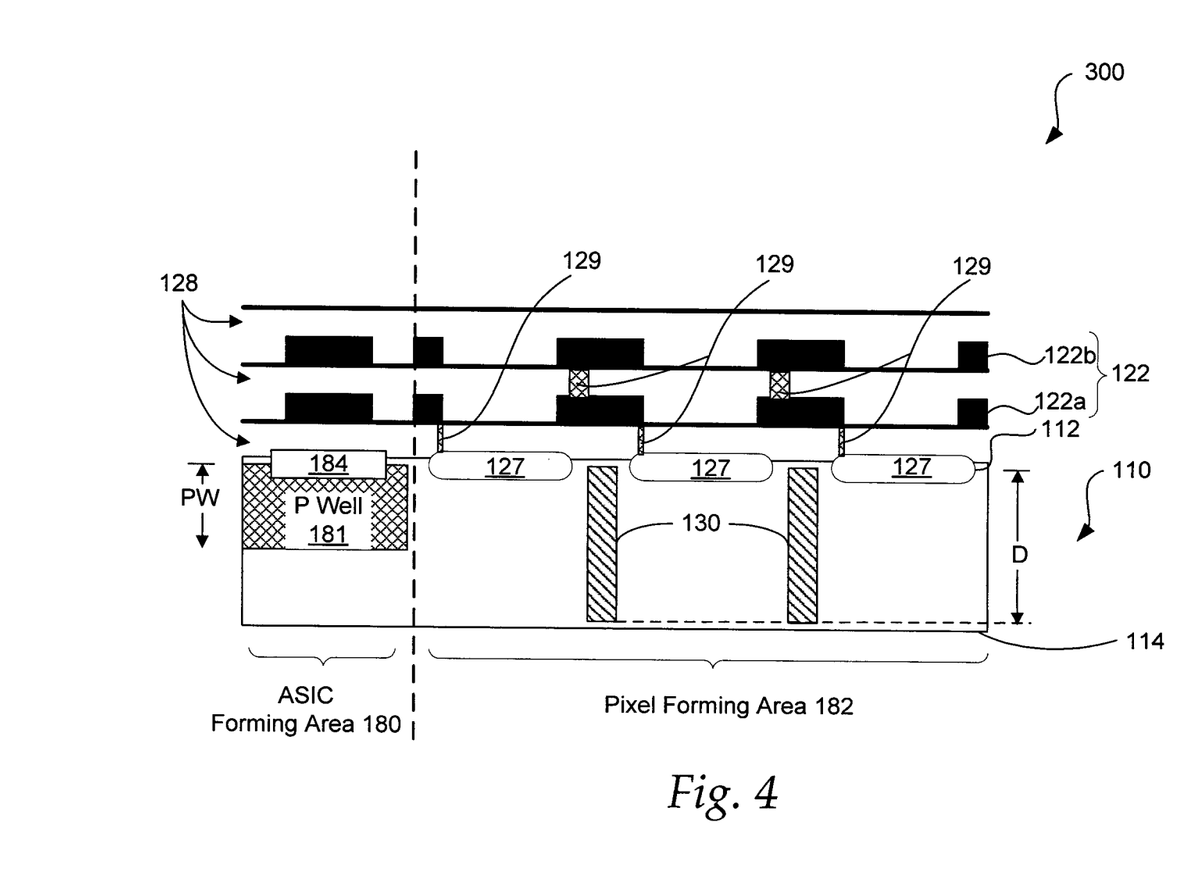
FIG. 4 is a sectional view of a sensor device formed alongside an application specific integrated circuit (ASIC), according to at least one embodiment.

FIG. 4 is a side view diagram of another embodiment of an image sensor 300, wherein and area 180 (also referred to as an application specific integrated circuit (ASIC) forming area), adjacent to a pixel forming area 182, includes a control circuit, e.g., an ASIC 184, that provides circuitry supporting pixels 120 and external communications to other devices. In at least one embodiment, the ASIC forming area 180 includes a p-well 181 of predetermined depth PW formed in the front side of the substrate 110. In some embodiments, the p-well 181 includes various p-wells and n-wells of various doping levels to form devices corresponding to the ASIC 184. Furthermore, in other embodiments, the p-well 181 made be replaced by an n-well that includes various p-wells and n-wells of various doping level to form devices corresponding to the ASIC 184. In some embodiments, depth PW is approximately 0.2 μm. Accordingly, the guard ring structure 130 is formed to have a depth D1 greater than or equal to depth PW of p-well 181. The depth D1 is less than or equal to the thickness of the substrate 110. If the depth of the guard ring structure 130 is less than the depth of the p-well 181, crosstalk may happen between the ASIC 184 and the adjacent pixels 120. For the above reasons, the guard ring structure 130 is preferably formed by a high-energy ion implantation. This high-energy ion implantation implants ions deep into the substrate 110, deeper than the depth PW. The high-energy ion implantation also causes more damage to the substrate and requires an effective annealing of this structure. This disclosure is not limited to the ASIC including only p-wells. The ASIC in some embodiments also includes an n-well structure, and the guard ring is formed to be as deep as or deeper than this n-well.

One or more embodiments of the present disclosure provide a method for improving sensitivity of and preventing crosstalk in backside illuminated image sensors, while minimizing or preventing damage to the image sensor that might occur during annealing.

What is claimed is:

1. A method of forming a backside illuminated image sensor, the method comprising:
   ion-implanting a guard ring structure of a predetermined depth in a front-side surface of a semiconductor substrate, the guard ring structure forming a two-dimensional array of pixels, each pixel of the array of pixels separated from an adjacent pixel by the guard ring structure;
   forming at least one image sensing element on the front-side surface of the semiconductor substrate, the at least one image sensing element being formed in a pixel of the array of pixels and surrounded by the guard ring structure; and
   reducing a thickness of the semiconductor substrate to a predetermined thickness by removing material from the back-side surface of the semiconductor substrate, wherein the thickness of the semiconductor substrate is reduced until the guard ring structure is co-planar with a back-side surface of the semiconductor substrate, whereby the guard ring structure extends from the front-side surface to the back-side surface of the semiconductor substrate having the reduced thickness.

2. The method of claim 1, further comprising:
   annealing the semiconductor substrate with the guard ring structure implanted therein; and
   after said annealing, forming a multi-layer interconnect (MLI) structure on the front-side surface of the semiconductor substrate to form electrical connections to the at least one image sensing element.

3. The method of claim 2, wherein the annealing comprises at least one selected from the group consisting of Rapid Thermal Annealing (RTA), laser annealing and furnace annealing.

4. The method of claim 1, wherein said ion-implanting comprises a high-energy ion implantation from the front-side surface towards the back-side surface of the semiconductor substrate.

5. The method of claim 4, wherein said semiconductor substrate includes an epitaxial layer of doped silicon, and wherein the high-energy ion implantation is performed in the epitaxial layer of doped silicon.

6. The method of claim 1, further comprising
   forming a control circuit on the front-side surface of the semiconductor substrate, said control circuit being isolated from the at least one image sensing element by the guard ring structure.

7. The method of claim 6, wherein
   the control circuit is formed to include a doped well; and
   the guard ring structure is implanted to extend at least as far from the front-side surface of the semiconductor substrate into the semiconductor substrate as said doped well.

8. The method of claim 1, wherein ion-implanting the guard ring structure comprises forming a two-dimensional array of pixels each pixel of the array of pixels separated from an adjacent pixel by the guard ring structure.

9. The method of claim 8, wherein forming the at least one image sensing element comprises forming each of the at least one image sensing element in one pixel of the array of pixels.

10. An image sensor, comprising:
    a semiconductor substrate, the substrate having a front-side surface and a back-side surface opposite the front-side surface;
    a plurality of image sensing elements formed on the front-side surface of the substrate; and
    an ion-implanted guard ring structure separating each of the image sensing elements from other image sensing elements, wherein the guard ring structure extends from the front-side surface of the substrate up to the back-side surface of the substrate and a surface of the guard ring is co-planar with the back-side surface of the substrate.

11. The image sensor according to claim 10, further comprising a multi-layer interconnect (MLI) electrically connected to the image sensing elements.

12. The image sensor according to claim 11, further comprising control circuitry formed on the front-side surface of the substrate and adjacent to the image sensing elements,
    wherein said control circuitry is electrically connected to the image sensing elements via the MLI and is separated, within the substrate, from the image sensing elements by the guard ring structure.

13. The image sensor according to claim 12, wherein the control circuitry includes a doped well formed in the front-side surface of the substrate, and wherein a depth of the guard ring structure is greater than or equal to that of the doped well.

14. The image sensor according to claim 13, wherein the doped well of the control circuitry and the guard ring structure are both p-wells.

15. The image sensor according to claim 10, wherein the image sensing elements comprise complementary metal-oxide-semiconductor (CMOS) image sensors.

16. The image sensor according to claim 10, wherein the guard ring structure defines a two-dimensional array of pixels, each pixel of the array of pixels being separated from an adjacent pixel by the guard ring structure, and each of the plurality of image sensing elements being in one pixel of the array of pixels.

17. A method of fabricating an image sensor device, comprising:
- forming a guard ring structure in a semiconductor substrate via ion implantation, said guard ring structure dividing the substrate into a two-dimensional array of pixels each pixel of the array of pixels separated from an adjacent pixel by the guard ring structure, wherein a surface of the guard ring structure is co-planar with a back-side surface of the substrate;
- forming a plurality of image sensing elements in the substrate, each of the image sensing elements being in one pixel of the two-dimensional array of pixels and surrounded by the guard ring structure; and
- annealing the substrate with the guard ring structure and image sensing elements formed therein.

18. The method of claim 17, wherein
- said forming the image sensing elements also comprises ion implantation; and
- said annealing removes damage to the substrate caused by the ion implantation during both said forming the image sensing elements and said forming the guard ring structure.

19. The method of claim 17, wherein said annealing is performed prior to any formation of a multi-layer interconnect (MLI) structure for providing electrical connections to the image sensing elements.

20. The method of claim 17, wherein the guard ring structure is implanted in a front-side surface of the substrate to extend farther from the front-side surface into the substrate than any doped well forming any circuitry in the substrate.

* * * * *